United States Patent [19]

Ando

[11] Patent Number: 5,412,232
[45] Date of Patent: May 2, 1995

[54] SEMICONDUCTOR DEVICE HAVING AN IMPROVED ELECTRON TRANSPORT PROPERTY AT A HIGH ELECTRIC FIELD

[75] Inventor: Yuji Ando, Tokyo, Japan
[73] Assignee: NEC Corporation, Tokyo, Japan
[21] Appl. No.: 209,065
[22] Filed: Mar. 11, 1993
[30] Foreign Application Priority Data Mar. 12, 1994 [JP] Japan ................. 5-051629

[51] Int. Cl.⁶ .................. H01L 27/12; H01L 29/161; H01L 29/205
[52] U.S. Cl. ..................... 257/194; 257/20; 257/22; 257/24; 257/192; 257/201; 257/615; 257/627
[58] Field of Search .............. 257/187, 192, 194, 201, 257/20, 22, 24, 615, 627

[56] References Cited

U.S. PATENT DOCUMENTS

| | | | |
|---|---|---|---|
| 4,158,577 | 6/1979 | Milnes | 257/461 |
| 4,797,716 | 1/1989 | Chaffin et al. | 257/18 |
| 4,914,489 | 4/1990 | Awano | 257/196 |
| 4,933,732 | 6/1990 | Katoh et al. | 257/197 |
| 4,958,208 | 9/1990 | Tanaka | 257/198 |
| 5,019,890 | 5/1991 | Ishibashi et al. | 257/197 |
| 5,144,378 | 9/1992 | Hikasaka | 257/196 |
| 5,148,245 | 9/1992 | Takikawa et al. | 257/194 |
| 5,150,185 | 9/1992 | Yamada | 257/197 |

OTHER PUBLICATIONS

Ismail, K., et al., "One-Dimensional Subbands And Mobility Modulation In GaAs/AlGaAs Quantum Wires", Applied Physics Letters, vol. 54, Mar. 1989, pp. 1130–1132.

*Primary Examiner*—Ngân V. Ngô
*Attorney, Agent, or Firm*—Popham, Haik, Schnobrich & Kaufman, Ltd.

[57] ABSTRACT

In a semiconductor device having quantum wire structure formed by first and second semiconductor layers, the first and the second semiconductor layers are used as quantum well and quantum barrier layers, respectively. The quantum well layer has a first conduction band having a first Γ-valley and a first L-valley. The first Γ-valley has a first Γ-valley energy level. The first L-valley has a first L-valley energy level which is not lower than the first Γ-valley energy level. The quantum barrier layer has a second conduction band having a second energy level which is higher than the first L-valley energy level. The quantum wire structure is extended towards a predetermined direction. More particularly, the predetermined direction is parallel to a crystal orientation of (100).

31 Claims, 10 Drawing Sheets

SEMICONDUCTOR DEVICE HAVING AN IMPROVED ELECTRON TRANSPORT PROPERTY AT A HIGH ELECTRIC FIELD

BACKGROUND OF THE INVENTION

This invention relates to a semiconductor device for use in a field effect transistor and, more particularly, to the semiconductor device having a quantum wire structure.

It is known in the art that a semiconductor device comprises a quantum wire structure which includes a heterojunction structure formed between a first semiconductor layer and a second semiconductor layer. Such a semiconductor device may be used as a field effect transistor which may be called a high electron mobility transistor.

A conventional semiconductor device of the above-mentioned type is disclosed in a title of "One-Dimensional Subbands and Mobility Modulation in GaAs/AlGaAs Quantum Wires" contributed by K. Ismail et al to Applied Physics Letters, Vol. 54, March 1989, pages 1130 to 1132.

In the conventional semiconductor device disclosed by K. Ismail et al, an undoped GaAs layer is used as the first semiconductor layer while an n-type AlGaAs layer is used as the second semiconductor layer.

Herein, it is to be noted that the undoped GaAs layer has a first conduction band consisting of three valleys which may be called a first Γ-valley, a first L-valley, and a first X-valley.

Similarly, the n-type AlGaAs layer has a second conduction band consisting of three valleys which may be called a second Γ-valley, a second L-valley, and a second X-valley.

Now, it will be assumed that the first Γ-valley, the first L-valley, and the first X-valley have a first Γ-valley energy level, a first L-valley energy level, and a first X-valley energy level, respectively. In addition, it will be assumed that the second Γ-valley, the second L-valley, and the second X-valley have a second Γ-valley energy level, a second L-valley energy level, and a second X-valley energy level, respectively.

The first Γ-valley energy level is defined by an energy level of the bottom of the first Γ-valley. The first L-valley energy level is defined by an energy level of the bottom of the first L-valley. The first X-valley energy level is defined by an energy level of the bottom of the first X-valley. The second Γ-valley energy level is defined by an energy level of the bottom of the second Γ-valley. Similarly, the second Γ-valley energy level is defined by an energy level of the bottom of the second Γ-valley. The second L-valley energy level is defined by an energy level of the bottom of the second L-valley. The second X-valley energy level is defined by an energy level of the bottom of the second X-valley.

In the conventional semiconductor device, the first Γ-valley has at least one one-dimensional subband inasmuch as the first Γ-valley energy level is lower than each of the second Γ-valley, the second L-valley, and the second X-valley energy levels so that the first Γ-valley has a quantum barrier in a heterojunction surface. On the other hand, the one-dimensional subband is not formed in each of the first L-valley and the first X-valley inasmuch as each of the first L-valley and the first X-valley energy levels is greater than at least one of the second Γ-valley, the second L-valley, and the second X-valley energy levels. As a result, electrons behave similar to electrons in a bulk semiconductor device.

On applying a high electric field on the conventional semiconductor device, electrons in the first Γ-valley are transited from the first Γ-valley to the first L-valley. Inasmuch as the effective mass of electrons is greater in the first L-valley than that of electrons in the first Γ-valley, the average drift velocity of electrons decreases till a drift velocity defined by materials of the conventional semiconductor device when the one-dimensional subband is not formed in the first L-valley as described above. As a result, it is difficult to improve an electron transport property at the high electric field in the conventional semiconductor device.

SUMMARY OF THE INVENTION

It is therefore an object of this invention to provide a semiconductor device capable of improving an electron transport property at the high electric field.

Other objects of this invention will become clear as the description proceeds.

According to this invention, there is provided a semiconductor device having a quantum wire structure formed by first and second semiconductor layers. The quantum wire structure is extended towards a predetermined direction. The first semiconductor layer comprises a first conduction band having a first Γ-valley and a first L-valley. The first Γ-valley has a first Γ-valley energy level. The first L-valley has a first L-valley energy level which is not lower than the first Γ-valley energy level. The second semiconductor comprises a second conduction band having a second energy level which is higher than the first L-valley energy level. The predetermined direction is parallel to a prescribed crystal orientation.

Figure 1:
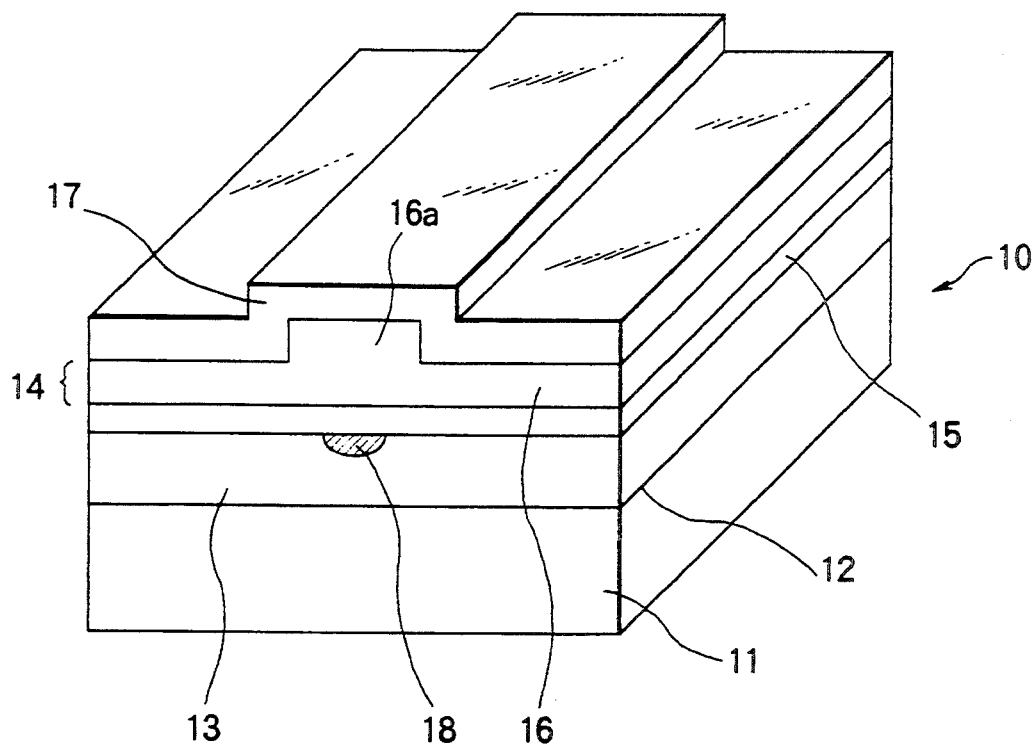
FIG. 1 shows a perspective view of a conventional semiconductor device.

DESCRIPTION OF THE PREFERRED EMBODIMENTS:

Prior Art:

Referring to FIG. 1, description will first be made as regards a conventional semiconductor device 10 for a better understanding of this invention. The semiconductor device 10 comprises a semi-insulating substrate 11 which has a principal surface 12 directed upwards in FIG. 1, a first semiconductor layer 13 on the principal surface 12, and a second semiconductor layer 14 on the first semiconductor layer 13. In the example being illustrated, the semi-insulating substrate 11 is composed of GaAs. The first semiconductor layer 13 may be called a buffer layer which is composed of an undoped GaAs. The second semiconductor layer 14 comprises a spacer film 15 and an electron supplying layer 16 on the spacer film 15. The spacer film 15 is composed of an undoped $Al_{0.3}Ga_{0.7}As$. The electron supplying layer 16 is composed of an n-type $Al_{0.3}Ga_{0.7}As$.

The electron supplying layer 16 is partially etched so that the electron supplying layer 16 has a projection portion 16a directed upwards in FIG. 1. The projection portion 16a has a wire structure therein. A gate electrode 17 is formed on the electron supplying layer 16 by evaporation.

In the illustrated example, a quantum wire structure is formed between the first semiconductor layer 13 and the second semiconductor layer 14 and includes a heterojunction structure.

On applying a voltage to the gate electrode 17, a one-dimensional electron gas (1DEG) 18 is generated in the first semiconductor layer 13 near the surface of the first semiconductor layer 13 and under the projection portion 16a to be used as a channel.

Figure 2:
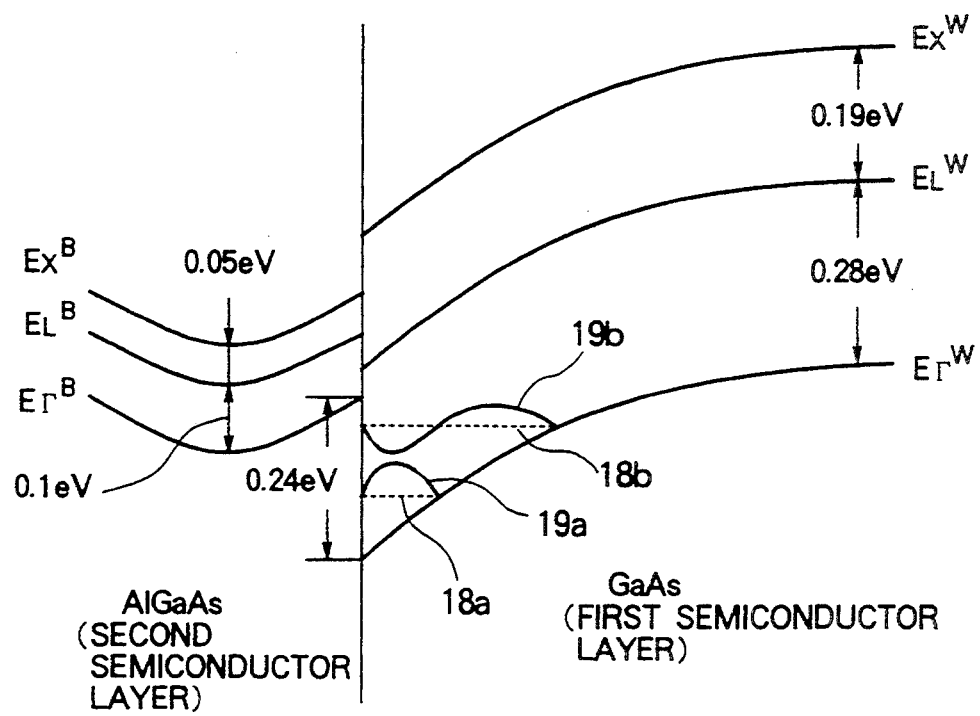
FIG. 2 is a potential profile for describing a quantum wire structure of the semiconductor device illustrated in FIG. 1.

Referring to FIG. 2 in addition to FIG. 1, description will proceed to a potential energy in relation to a direction perpendicular to a heterojunction surface near 1DEG 18. The first semiconductor layer 13 has a first conduction band comprising a first Γ-valley, a first L-valley, and a first X-valley. Similarly, the second semiconductor layer 14 has a second conduction band comprising a second Γ-valley, a second L-valley, and a second X-valley.

The first Γ-valley has a first Γ-valley potential energy level defined by an energy level of the bottom of the first Γ-valley and depicted by $E_Γ^W$ in FIG. 2. The first L-valley has a first L-valley potential energy level defined by an energy level of the bottom of the first L-valley and depicted by $E_L^W$. The first X-valley has a first X-valley potential energy level defined by an energy level of the bottom of the first X-valley and depicted by $E_X^W$. Similarly, the second Γ-valley has a second Γ-valley potential energy level defined by an energy level of the bottom of the second Γ-valley and depicted by $E_Γ^B$ in FIG. 2. The second L-valley and the second X-valley have second L-valley and the second X-valley potential energy levels depicted by $E_L^B$ and $E_X^B$, respectively. The second L-valley potential energy level is defined by an energy level of the bottom of the second L-valley. The second X-valley potential energy level is defined by an energy level of the bottom of the second X-valley.

The second Γ-valley, the second L-valley, and the second X-valley potential energy levels may be collectively called a second potential energy level.

As shown in FIG. 2, the first L-valley potential energy level is higher in 0.28 eV than the first Γ-valley potential energy level. The first X-valley potential energy level is higher in 0.19 eV than the first L-valley potential energy level. The second L-valley potential energy level is higher in 0.1 eV than the second Γ-valley potential energy level. The second X-valley potential energy level is higher in 0.05 eV than the second L-valley potential energy level. Furthermore, it is noted that the first Γ-valley potential energy level is lower in 0.24 eV than the second Γ-valley potential energy level at the heterojunction surface. Namely, the first Γ-valley has a quantum barrier of 0.24 eV at the heterojunction surface.

As readily understood in FIG. 2, the first Γ-valley has at least one one-dimensional subband because the first Γ-valley potential energy level is lower than the second potential energy level. More particularly, the first Γ-valley has a pair of one-dimensional subbands of which levels are depicted by reference numbers 18a and 18b, respectively. In the one-dimensional subband having the level depicted by 18a, electrons have a wave function depicted by a reference number 19a. In the one-dimensional subband having the level depicted by 18b, electrons have a wave function depicted by a reference number 19b. Inasmuch as the second Γ-valley potential energy level is lower than each of the first L-valley and the first X-valley potential energy levels, the one-dimensional subband is not formed in each of the first L-valley and the first X-valley.

Attention will be directed to the quantum wire structure. As described above, the first Γ-valley has at least one one-dimensional subband. In the illustrated example, the one-dimensional subband in the first Γ-valley will be called a first one-dimensional subband.

It will be assumed that the quantum structure has a rectangle in a cross section. The rectangle has a width of Ly and a thickness of Lz. The potential energy level $\epsilon_{mn}$ of the first one-dimensional subband is given by:

$$\epsilon_{mn} = \{\eta^2(h/2\eta)^2/2m^*Γ\}\{(m/Ly)^2 + (n/Lz)^2\}, \quad (1)$$

where m represents quantum number relative to the direction of the width. n represents quantum number relative to the direction of the thickness. m*Γ represents the effective mass of electron in the first primary Γ-valley. h represents Planck constant.

Now, it will be assumed that each of the width Ly and the thickness Lz is equal to 150 angstroms. When m*Γ is $0.067m_0$, where $m_0$ represents a mass of a free electron, a ground level is represented by $\epsilon_{11}$ which becomes to 50 meV. A first excitation level is represented by $\epsilon_{12}$ or $\epsilon_{21}$ which becomes to 120 meV. Inasmuch as the first excitation level is greater in 70 meV than the ground level, electrons transit from ground level to the first excitation level when the electric field is applied to the quantum wire structure at several hundreds of volts per centimeter (V/cm). Inasmuch as the first L-valley potential energy level is higher in 230 meV than the ground level, electrons transit from the first Γ-valley to the first L-valley when the electric field is applied to the quantum wire structure at several thousands of V/cm.

As described above, the effective mass of electron becomes great in the first L-valley. As a result, electron has a low velocity in the first L-valley.

As readily understood from the above description, electrons are transited from the first Γ-valley to the first L-valley when the semiconductor device 10 is supplied with a very high electric field. Inasmuch as the effective mass of electron becomes great in the first L-valley as described above, quantum limit is not materialized so that the drift velocity of electrons decreases to a saturation velocity which is defined by materials of the first and the second semiconductor layers. Namely, it is difficult to improve an electron transport property at very high electric field in the semiconductor device 10.

Principle of the Invention:

Description will proceed to a principle of this invention.

In general, the quantum wire structure is formed by the first semiconductor layer and the second semiconductor layer on the first semiconductor layer. The first semiconductor layer serves as a quantum well layer. The second semiconductor layer serves as a quantum barrier layer.

Now, it will be assumed that the first Γ-valley potential energy level is represented by $E_{C1}$. It will be assumed that the first L-valley potential energy level is represented by $E_{L1}$. It will be assumed that the second potential energy level is represented by $E_{C2}$.

Let electron affinity be represented by $\chi_1$ in the quantum well layer. Let electron affinity be represented by $\chi_2$ in the quantum barrier layer. Let an energy gap be represented by $\Delta E_{L1}$ between the first Γ-valley potential energy level and the first L-valley potential energy level. According to Anderson model, the first Γ-valley potential energy level, the first L-valley potential energy level, and the second potential energy level are respectively given by:

$$\left.\begin{array}{l} E_{c1} = -\chi_1 \\ E_{L1} = -\chi_1 + \Delta E_{L1} \\ E_{c2} = -\chi_2 \end{array}\right\} \quad (2)$$

As described above, it is necessary to make the first L-valley potential energy level be lower than the second potential energy level in order to improve the electron transport property at the high electric field. Namely, it is necessary to obtain Inequality given by:

$$E_{c1} \leqq E_{L1} < E_{c2} \quad (3)$$

By use of Equation (2), Inequality (3) is rewritten into Inequality given by:

$$0 \leqq \Delta E_{L1} 21 \chi_1 - \chi_2 \quad (4)$$

It is noted that the first L-valley has at least one one-dimensional subband when a quantum well structure is formed by the use of materials satisfying Inequality (4). In this case, the quantum well structure has a sectional size whose dimension is approximately equal to de Broglie wavelength of electron.

The quantum wire structure is extended towards a predetermined direction. The predetermined direction is parallel to a prescribed crystal orientation which may be the crystal orientation of (100). In a case where the predetermined direction is parallel to the crystal orientation of (100), electrons are able to move to only the crystal orientation of (100) in each of the first Γ-valley and the first L-valley with restraining electrons from moving towards a direction perpendicular to the crystal orientation of (100) in the one-dimensional subband of each of the first Γ-valley and the first L-valley. On the other hand, the scattered electrons move at random in the first L-valley as known in the art.

Figure 3:
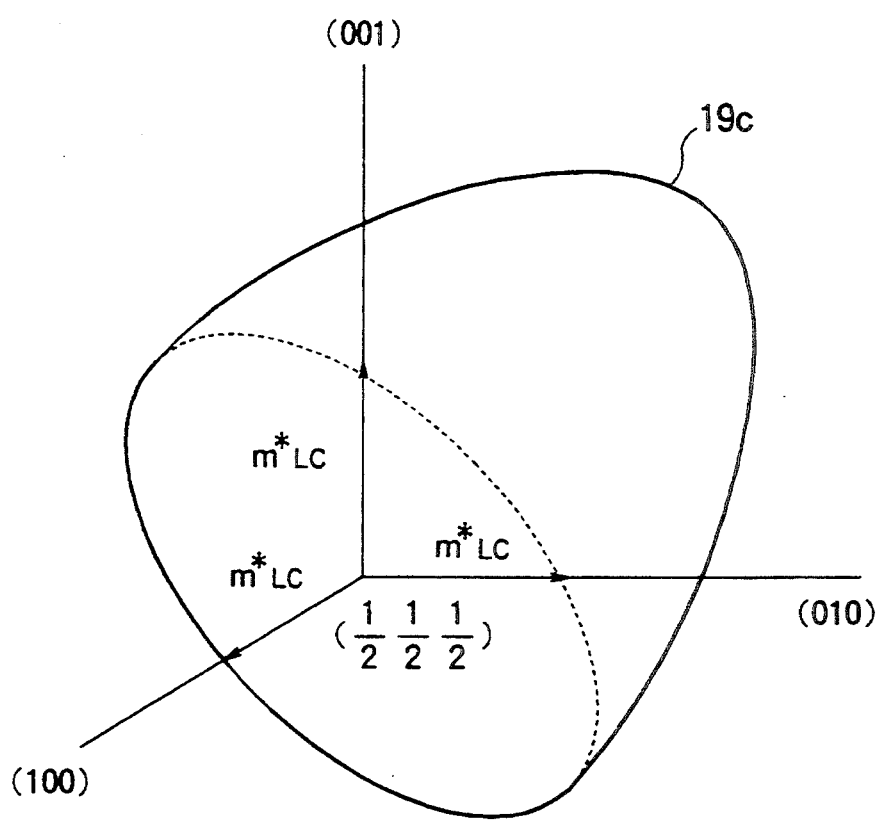
FIG. 3 is a diagram for illustrating a constant-energy surface in an L-valley of a semiconductor device having a diamond structure or a zinc-blende structure as a crystalline structure;.

Referring to FIG. 3, it will be assumed that a semiconductor has either one of a diamond structure and a zinc-blende structure in a crystalline structure. When the semiconductor has either one of the diamond structure and the zinc-blende structure in the crystalline structure, a constant-energy surface is illustrated in the first L-valley as depicted by a reference numeral 19c. In a space defined by momentum, the constant-energy surface forms a spheroid having a maximum effect mass in the crystal orientation of (111). When electrons move to the crystal orientation of (100), the effective mass of electrons is represented as a conductivity effective mass $m^*_{LC}$ given by:

$$m^*_{LC} = 3(2/m^*_{Lt} + 1/m^*_{Ll})^{-1}, \quad (5)$$

where $m^*_{Lt}$ represents a transversal effective mass of electrons in the first L-valley. $m^*_{Ll}$ represents a longitudinal effective mass of electrons in the first L-valley.

When electrons move at random, the effective mass of electrons is represented as a density-of-state effective mass $m^*_{LD}$ given by:

$$m^*_{LD} = (m^*_{Ll} \cdot m^*_{Lt}{}^2)^{1/3} \quad (6)$$

When the quantum well layer is composed of GaAs, the transversal effective mass becomes to $0.075m_0$, where $m_0$ represents a mass of a free electron. The longitudinal effective mass becomes to $1.9m_0$.

Inasmuch as the transversal effective mass is not equal to the longitudinal effective mass as described above, the density-of-state effective mass is greater than the conductivity effective mass. When the quantum well layer is composed of GaAs, the conductivity effective mass and the density-of-state effective mass become to $0.11m_0$ and $0.22m_0$, respectively. Namely, the conductivity effective mass is equal to a half of the density-of-state effective mass.

Figure 4:
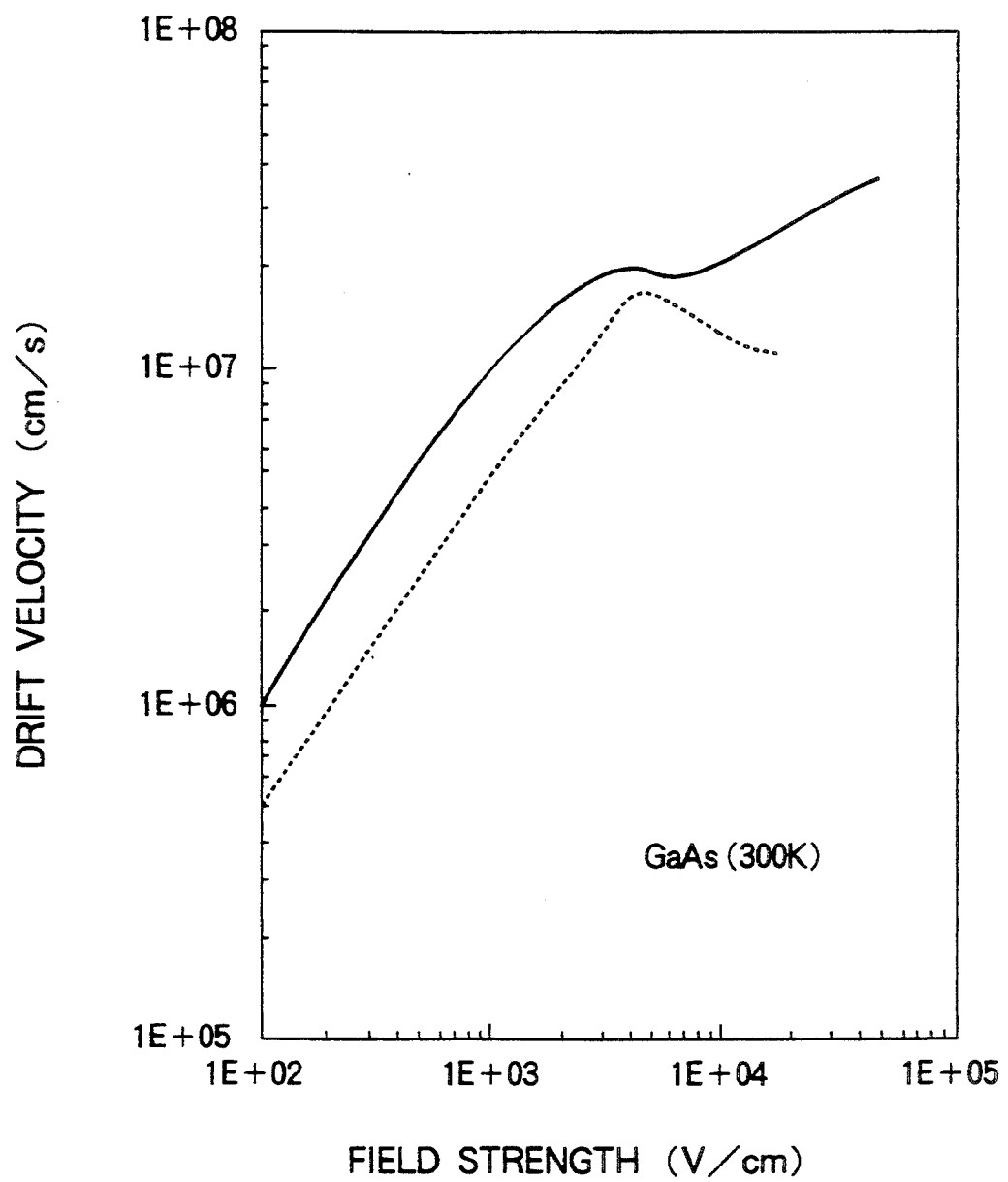
FIG. 4 is a diagram for illustrating relationship between a drift velocity and a field strength.

In the quantum wire structure having the quantum well layer composed of GaAs, calculation is carried out to obtain a relationship between a drift velocity and a field strength by the use of Monte Carlo method as shown by a solid line in FIG. 4. For convenience of description, calculation is carried out in a bulk semiconductor composed of GaAs to obtain a relationship between a drift velocity and a field strength by the use of Mote Carlo method as shown by a broken line in FIG. 4.

As readily understood from FIG. 4, it is possible to improve the electron transport property in the semiconductor device having the quantum wire structure according to this invention when the quantum wire structure is extended towards the crystal orientation of (100) and when the one-dimensional subband is formed in the first L-valley.

Figure 5:
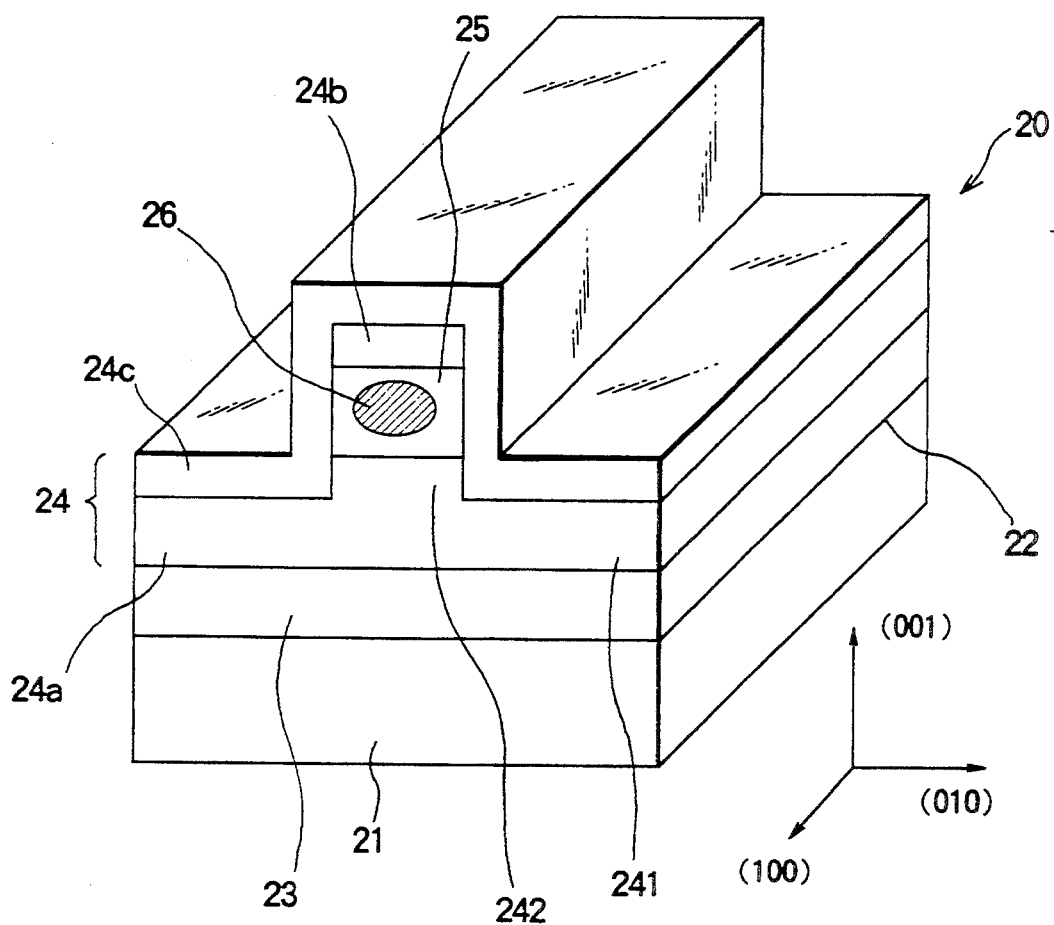
FIG. 5 shows a perspective view of a semiconductor device according to a first embodiment of this invention.

Embodiments:

Referring to FIG. 5, description will proceed to a semiconductor device 20 of a first embodiment according to this invention. The illustrated semiconductor device 20 comprises a semi-insulating substrate 21 which has a principal surface 22 directed upwards in FIG. 5 and a buffer layer 23 on the principal surface 22. The semiconductor device 20 further comprises an electron supplying layer 24 and a quantum well layer 25.

In the example being illustrated, the semi-insulating substrate 21 is composed of GaAs and has the crystal surface of (001). The buffer layer 23 is composed of GaAs which is undoped. It is noted that the electron supplying layer 24 comprises first through third supplying films 24a to 24c each of which is composed of an n-type AlGaAs. The quantum well layer 25 is composed of undoped InGaAs and is interposed among the first through the third supplying films 24a to 24c. The quantum well layer 25 has a quantum wire structure of which the orientation is parallel to the crystal orientation of (100).

On manufacturing the semiconductor device 20 illustrated in FIG. 5, the semi-insulating substrate 21 is prepared which has a front surface and a rear surface directed upwards and downwards in FIG. 5, respectively.

The buffer layer 23 is formed or deposited on the principal surface 22 to the thickness of 1 $\mu$m by the use of Molecular Beam Epitaxy (MBE). After deposition of the buffer layer 23, a first film or layer is deposited on the buffer layer 23 to the thickness of 350 angstroms by MBE. The first film is composed of an n-type $Al_{0.45}Ga_{0.55}As$ of which a doping density is equal to $3 \times 10^{18}/cm^3$. Sequentially, a second film is deposited on the first film to the thickness of 100 angstroms by MBE. The second film is composed of an undoped $In_{0.2}Ga_{0.8}As$. A third film is deposited on the second film by MBE to the thickness of 200 angstroms. The third film is composed of an n-type $Al_{0.45}Ga_{0.55}As$ of which a doping density is equal to $3 \times 10^{18}/cm^3$.

With Electron Beam lithography, the first through the third films are etched by the use of a mask which has a predetermined pattern. The first film is etched into the first supplying film 24a having a plate portion 241 and a projection portion 242 on a center of the plate portion 241. The second film is etched into the quantum well layer 25 on the projection portion 242. The third film is etched into the second supplying film 24b on the quantum well layer 25. As described above, the quantum well layer 25 has the quantum wire structure of which the crystal orientation is parallel to (100) orientation and of which the width is 100 angstroms.

After etching, the third supplying film 24c is formed by MBE so as to cover the first and the second films 24a and 24b and the quantum well layer 25. The third supplying film 24c is composed of an n-type $Al_{0.45}Ga_{0.55}As$ of which a doping density is equal to $3 \times 10^{18}/cm^3$.

When applying the electric field to the semiconductor device 20, the one-dimensional electron gas is generated in the quantum well layer 25 and will be designated by a reference numeral 26 in FIG. 5.

The quantum well layer 25 has the first conduction band comprising the first $\Gamma$-valley, the first L-valley, and the first X-valley. Consequently, the quantum well layer 25 serves as the first semiconductor layer. On the other hand, the electron supplying layer 24 has the second conduction band comprising the second $\Gamma$-valley, the second L-valley, and the second X-valley. Therefore, the electron supplying layer 24 serves as the second semiconductor layer.

Figure 6:
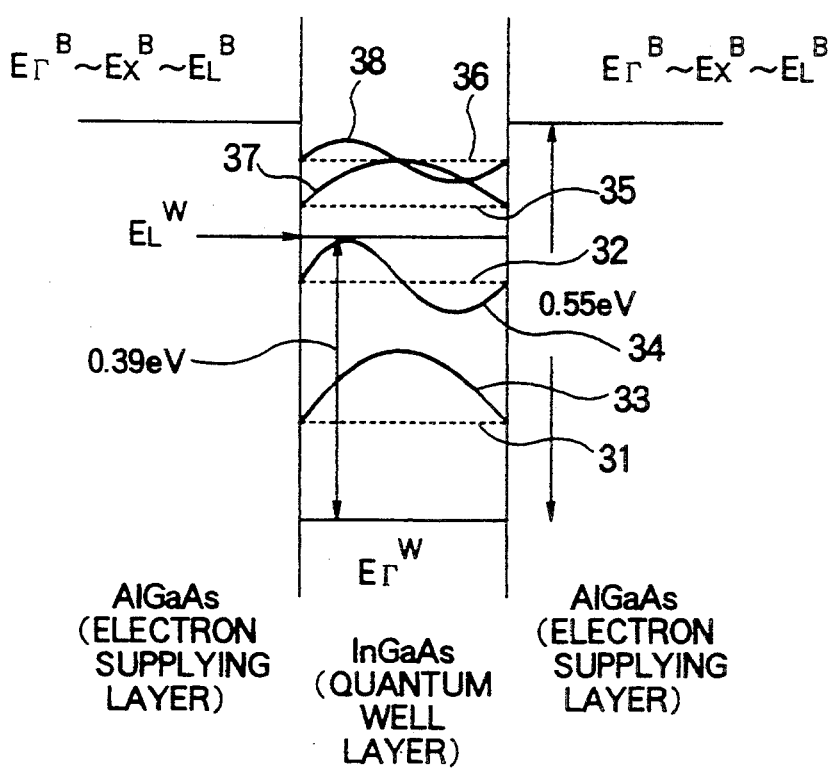
FIG. 6 is a potential profile for describing a quantum wire structure of the semiconductor device illustrated in FIG. 5.

Referring to FIG. 6, description will proceed to a potential energy level in relation to a direction perpendicular to the quantum wire structure of the semiconductor device 20 illustrated in FIG. 5. In FIG. 6, $E_\Gamma^W$ and $E_L^W$ represent the first $\Gamma$-valley potential energy level and the first L-valley potential energy level, respectively, as described in conjunction with FIG. 2. Similarly, $E_\Gamma^B$, $E_L^B$, and $E_X^B$ represent the second $\Gamma$-valley potential energy level, the second L-valley potential energy level, and the second X-valley potential energy level, respectively.

Now, let $m^*\Gamma$ be $0.054m_0$ in Equation (1). Inasmuch as each of the width and the thickness is equal to 100 angstroms in the quantum wire structure, the ground level $\epsilon_{11}$ becomes to 0.14 eV in the first $\Gamma$-valley. Each of the first excitation levels $\epsilon_{12}$ and $\epsilon_{21}$ becomes to 0.35 eV.

As shown in FIG. 6, the first $\Gamma$-valley potential energy level is lower in 0.39 eV than the first L-valley potential energy level. Each of the second $\Gamma$-valley, the second L-valley, and the second X-valley potential energy levels is approximately equal to one another. The first $\Gamma$-valley potential energy level is lower in 0.55 eV than the second $\Gamma$-valley potential energy level at the heterojunction surface between the quantum well layer 25 and the electron supplying layer 24.

Accordingly, the first $\Gamma$-valley has at least one one-dimensional subband. In the example being illustrated in FIG. 6, the first $\Gamma$-valley has a pair of one-dimensional subbands of which levels are depicted by reference numbers 31 and 32, respectively. In the one-dimensional subband having the level depicted by 31, electrons have a wave function depicted by a reference number 33. In the one-dimensional subband having the level depicted by 32, electrons have a wave function depicted by a reference number 34.

Similarly, the first L-valley has at least one one-dimensional subband inasmuch as the first L-valley potential energy level is less in 0.16 eV than the second potential energy level. In the example being illustrated in FIG. 6, the first L-valley has a pair of one-dimensional subbands of which levels are depicted by reference numbers 35 and 36, respectively. In the one-dimensional subband having the level depicted by 35, electrons have a wave function depicted by a reference number 37. In the one-dimensional subband having the level depicted by 36, electrons have a wave function depicted by a reference number 38.

As readily understood from the above description, the electron supplying layer 24 serves as a quantum barrier layer in the first embodiment.

Now, it will be assumed that quantum well layer 25 is composed of $In_xGa_{1-x}As$ and the electron supplying layer 24 is composed of $Al_yGa_{1-y}As$, where x represents a variable between zero and one (both exclusive) and y represents a variable between zero and one (both exclusive). The electron affinity becomes to a minimum value when the variable y is equal to 0.45 in $Al_yGa_{1-y}As$. When the variable y is not less than 0.35 and is not greater than 0.55, Equation (3) is satisfied with having no concern with the variable x. It is desirable for the variable x to be large in order to effectively improve the electron transport property in the semiconductor device inasmuch as the electron affinity monotonously increases as the variable x increases in $In_xGa_{1-x}As$. However, the variable x is limited by a critical layer thickness inasmuch as the lattice constant of InGaAs is different from that of AlGaAs.

In Equation (1), it will be assumed that the width Ly and the thickness Lz are equal to each other. When each of the width Ly and the thickness Lz is equal to 50 angstroms, the ground state level is estimated as 0.56 eV in the first Γ-valley in case where m*Γ is equal to $0.054m_0$. When each of the width Ly and the thickness Lz is equal to 100 angstroms, the ground state level is estimated as 0.14 eV in the first Γ-valley in case where m*Γ is equal to $0.054m_0$.

As described above in conjunction with FIG. 6, the first L-valley potential energy level is greater in 0.39 eV than the first Γ-valley potential energy level when the quantum well layer 25 is composed of $In_{0.2}Ga_{0.8}As$. Therefore, the thickness should not be less than 100 angstroms in the quantum well layer 25 to make the semiconductor device maintain a one-dimensional confinement and to prevent the semiconductor device from an indirect transition type. In the quantum well layer composed of $In_xGa_{1-x}As$, a misfit dislocation occurs in the quantum well layer 25 when the thickness of the quantum well layer 25 is 150 angstroms at the variable x=0.2. The misfit dislocation occurs in the quantum well layer 25 when the thickness of the quantum well layer 25 is 80 angstroms at the variable x=0.3. Accordingly, the variable x is selected within a value which is not greater than 0.3.

Figure 7:
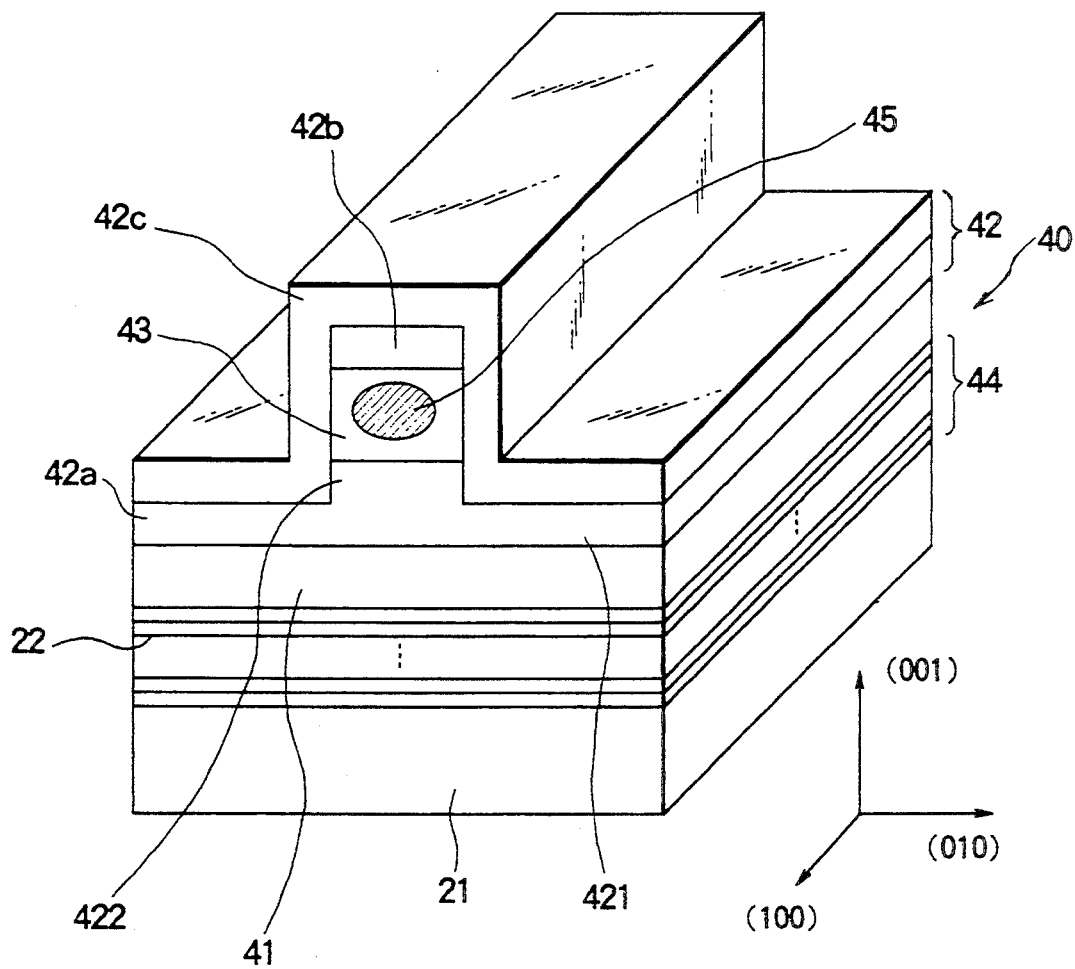
FIG. 7 shows a perspective view of a semiconductor device according to a second embodiment of this invention.

Referring to FIG. 7, description will proceed to a semiconductor device of a second embodiment according to this invention. The illustrated semiconductor device is different in structure from the semiconductor device 20 illustrated in FIG. 5 and is therefore designated afresh by a reference numeral 40. The semiconductor device 40 comprises the semi-insulating substrate 21 which is described in conjunction with FIG. 5. The semiconductor device 40 comprises the buffer layer, the electron supplying layer, and the quantum well layer each of which is different in composition from the semiconductor device 20. Therefore, the buffer layer, the electron supplying layer, and the quantum well layer of the semiconductor device 40 will be designated by reference numerals 41, 42, and 43, respectively. The semiconductor device 40 further comprises a superlattice layer 44 between the semi-insulating substrate 21 and the buffer layer 41.

In the example being illustrated, the superlattice layer 44 is composed of undoped GaSb/AlSb. The buffer layer 41 is composed of undoped AlGaSb. It is noted that the electron supplying layer 42 comprises first through third supplying films 42a to 42c each of which is composed of an n-type AlSb. The quantum well layer 43 is composed of undoped InAs and is interposed among the first through the third supplying films 42a to 42c. The quantum well layer 43 has a quantum wire structure of which the crystal orientation is parallel to (100) orientation.

On manufacturing the semiconductor device 40 illustrated in FIG. 7, the semi-insulating substrate 21 is prepared which has a front surface and a rear surface directed upwards and downwards in FIG. 7, respectively.

The superlattice layer 44 is formed on the principal surface 22 by the use of Molecular Beam Epitaxy (MBE). More particularly, the superlattice layer 44 comprises a plurality of film pairs. In the illustrated example, the number of film pairs is equal to twenty. Each of the film pairs has primary and secondary films. The primary film is composed of undoped GaSb and has the thickness of 40 angstroms. The secondary film is composed of undoped AlSb and has the thickness of 40 angstroms. The secondary film is formed on the primary film.

The buffer layer 41 of undoped $Al_{0.7}Ga_{0.3}Sb$ is deposited or formed on the superlattice layer 44 to the thickness of 1000 angstroms by MBE. After deposition of the buffer layer 41, a first film is deposited on the buffer layer 41 to the thickness of 200 angstroms by MBE. The first film is composed of an n-type AlSb of which a doping density is equal to $3 \times 10^{18}/cm^3$. Sequentially, a second film is deposited on the first film to the thickness of 80 angstroms by MBE. The second film is composed of an undoped InAs. A third film is deposited on the second film by MBE to the thickness of 200 angstroms. The third film is composed of an n-type AlSb of which a doping density is equal to $3 \times 10^{18}/cm^3$.

With Electron Beam lithography, the first through the third films are etched by the use of a mask which has a predetermined pattern. The first film is etched into the first supplying film 42a having a plate portion 421 and a projection portion 422 on a center of the plate portion 421. The second film is etched into the quantum well layer 43 on the projection portion 422. The third film is etched into the second supplying film 42b on the quantum well layer 43. As described above, the quantum well layer 43 has the quantum wire structure of which the crystal orientation is parallel to (100) orientation and of which the width is 160 angstroms.

After etching, the third supplying film 42c is formed by MBE so as to cover the first and the second supplying films 42a and 42b and the quantum well layer 43. The third supplying film 24c is composed of an n-type AlSb of Which a doping density is equal to $3 \times 10^{18}/cm^3$.

In the semiconductor device 40, the lattice constant of the semi-insulating substrate 21 is different from that of the buffer layer 41. Inasmuch as the superlattice layer 44 is located between the semi-insulating substrate 21 and the buffer layer 41, the superlattice layer 44 serves to dissolve a lattice mismatch between the semi-insulating substrate 21 and the buffer layer 41.

When applying the electric field to the semiconductor device 40, the one-dimensional electron gas is generated in the quantum well layer 43 and will be designated by a reference numeral 45 in FIG. 7.

As readily understood from description in conjunction with FIG. 7, the quantum well layer 43 serves as the first semiconductor layer. The electron supplying layer 42 serves as the second semiconductor layer.

Figure 8:
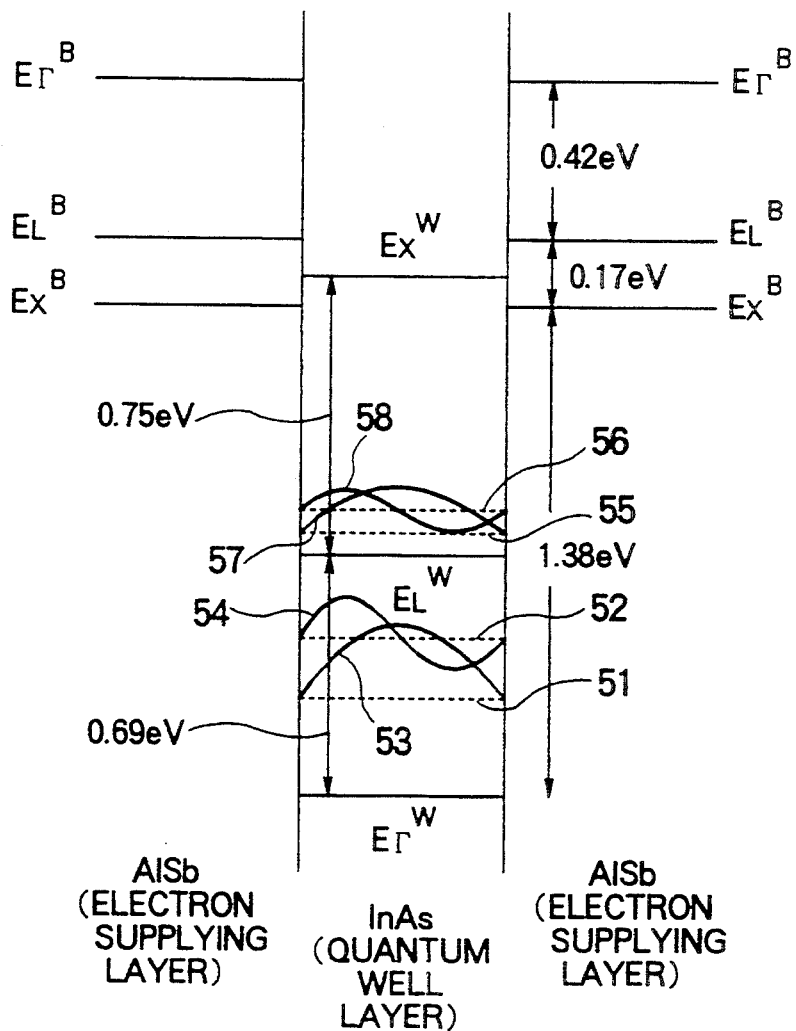
FIG. 8 is a potential profile for describing a quantum wire structure of the semiconductor device illustrated in FIG. 7.

Referring to FIG. 8, description will proceed to a potential energy level in relation to a direction perpendicular to the quantum wire structure of the semiconductor device 40 illustrated in FIG. 7. In FIG. 8, $E_Γ^W$, $E_L^W$, and $E_X^W$ represent the first Γ-valley, the first L-valley, and the first X-valley potential energy levels, respectively, as described in conjunction with FIG. 2. Similarly, $E_Γ^B$, $E_L^B$, and $E_X^B$ represent the second Γ-valley, the second L-valley, and the second X-valley potential energy levels, respectively.

Now, let m*Γ be $0.027m_0$ in Equation (1). Inasmuch as the width Ly and the thickness Lz is equal to 80 angstroms and 160 angstroms in the quantum wire structure, respectively, the ground level $\epsilon_{11}$ becomes to 0.27 eV in the first Γ-valley. The first excitation level $\epsilon_{12}$ becomes to 0.41 eV in the first Γ-valley.

As shown in FIG. 8, the first Γ-valley potential energy level is lower in 0.69 eV than the first L-valley potential energy level. The first L-valley potential energy level is lower in 0.75 eV than the first X-valley potential energy level. On the other hand, the second Γ-valley potential energy level is higher in 0.42 eV than the second L-valley potential energy level. The second L-valley potential energy level is higher in 0.17 eV than the second X-valley potential energy level. Furthermore, the first Γ-valley potential energy level is lower in 1.38 eV than the second X-valley potential energy level at the heterojunction surface between the quantum well layer 43 and the electron supplying layer 42.

Accordingly, the first Γ-valley has at least one one-dimensional subband. In the example being illustrated in FIG. 8, the first Γ-valley has a pair of one-dimensional subbands of which levels are depicted by reference numbers 51 and 52, respectively. In the one-dimensional subband having the level depicted by 51, electrons have a wave function depicted by a reference number 53. In the one-dimensional subband having the level depicted by 52, electrons have a wave function depicted by a reference number 54.

Similarly, the first L-valley has at least one one-dimensional subband inasmuch as the first L-valley potential energy level is less than the second potential energy level. In the example being illustrated in FIG. 8, the first L-valley has a pair of one-dimensional subbands of which levels are depicted by reference numbers 55 and 56, respectively. In the one-dimensional subband having the level depicted by 55, electrons have a wave function depicted by a reference number 57. In the one-dimensional subband having the level depicted by 56, electrons have a wave function depicted by a reference number 58.

As readily understood from the above description, the electron supplying layer 42 serves as a quantum barrier layer in the second embodiment.

Now, it will be assumed that the electron supplying layer 42 is composed of $Al_yGa_{1-y}Sb$. Equation (3) is satisfied with having no concern with the variable y. It is desirable to make the variable y be one in order to effectively improve the electron transport property in the semiconductor device 40 inasmuch as the electron affinity monotonously decreases as the variable x increases in $Al_yGa_{1-y}Sb$.

Figure 9:
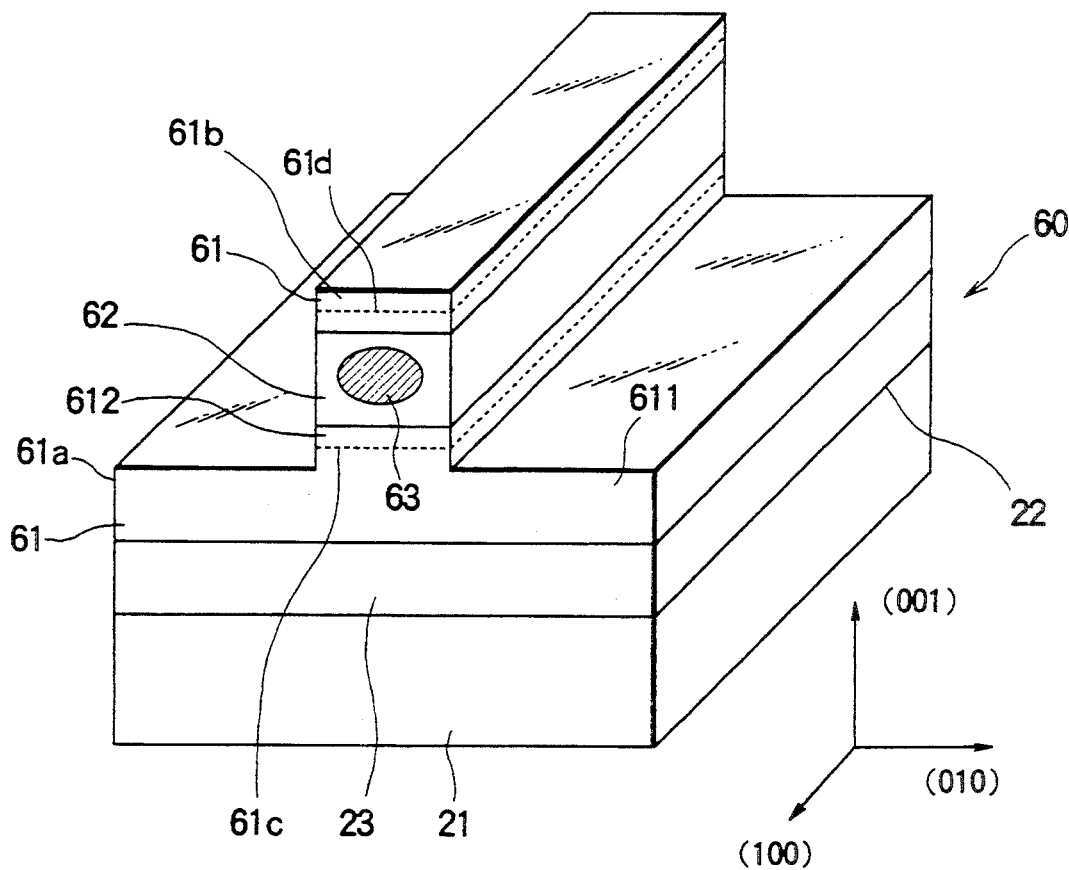
FIG. 9 shows a perspective view of a semiconductor device according to a third embodiment of this invention.

Referring to FIG. 9, description will proceed to a semiconductor device of a third embodiment according to this invention. The illustrated semiconductor device is different in structure from the semiconductor device 20 illustrated in FIG. 5 and is therefore designated afresh by a reference numeral 60. The semiconductor device 60 comprises the semi-insulating substrate 21 and the buffer layer 23 each of which is described in conjunction with FIG. 5. The semiconductor device 60 comprises an electron supplying layer and a quantum well layer each of which is different in composition from the semiconductor device 20. Therefore, the electron supplying layer and the quantum well layer of the semiconductor device 60 will be designated by reference numerals 61 and 62, respectively.

In the example being illustrated, it is noted that the electron supplying layer 61 comprises first and second supplying films 61a and 62b each of which is composed of undoped InAlGaP. The quantum well layer 62 is composed of undoped GaAs and is interposed between the first supplying film 61a and the second supplying film 61b. Each of the first and the second, supplying films 61a and 61b has a thin film as shown by a broken line in FIG. 9. The thin film is composed of silicon and may be called a δ doped Si film. The δ doped Si film in the first supplying film 61a will be designated by a reference numeral 61c. The δ doped Si film in the second supplying film 61b will be designated by a reference numeral 61d. The quantum well layer 62 has a quantum wire structure of which the crystal orientation is parallel to (100) orientation.

On manufacturing the semiconductor device 60 illustrated in FIG. 9, the semi-insulating substrate 21 is prepared which has a front surface and a rear surface directed upwards and downwards in FIG. 9, respectively.

The buffer layer 23 is formed on the principal surface 22 to the thickness of 1 μm by the use of Molecular Beam Epitaxy (MBE). A first film is deposited on the buffer layer 23 to the thickness of 1000 angstroms by MBE. The first film is composed of undoped $In_{0.49}(Al_{0.7}Ga_{0.3})_{0.51}P$. Sequentially, a second film of silicon is formed on the first film by MBE at a sheet density of $1 \times 10^{13}/cm^2$. A third film of undoped $In_{0.49}(Al_{0.7}Ga_{0.3})_{0.51}P$ is deposited on the second film by MBE to the thickness of 50 angstroms. A fourth film of undoped GaAs is deposited on the third film by MBE to the thickness of 150 angstroms. A fifth film of undoped $In_{0.49}(Al_{0.7}Ga_{0.3})_{0.51}P$ is deposited on the fourth film by MBE to the thickness of 50 angstroms. A sixth film of silicon is formed on the fifth film by MBE at a sheet density of $1 \times 10^{13}/cm^2$. A seventh film is deposited on the sixth film by MBE to the thickness of 200 angstroms.

With Electron Beam lithography, the first through the seventh films are etched by the use of a mask which has a prescribed pattern. The first through the third films are etched into the first supplying film 61a having a plate portion 611 and a projection portion 612 on a center of the plate portion 611. The fourth film is etched into the quantum well layer 62 on the projection portion 612. The fifth through the seventh films are etched into the second supplying film 61b on the quantum well layer 62. As described above, the quantum well layer 62 has the quantum wire structure of which the crystal orientation is parallel to (100) orientation and of which the width is 150 angstroms.

When applying the electric field to the semiconductor device 60, the one-dimensional electron gas is generated in the quantum well layer 62 and will be designated by a reference numeral 63 in FIG. 9.

As readily understood from description in conjunction with FIG. 9, the quantum well layer 62 serves as the first semiconductor layer. The electron supplying layer 61 serves as the second semiconductor layer.

Figure 10:
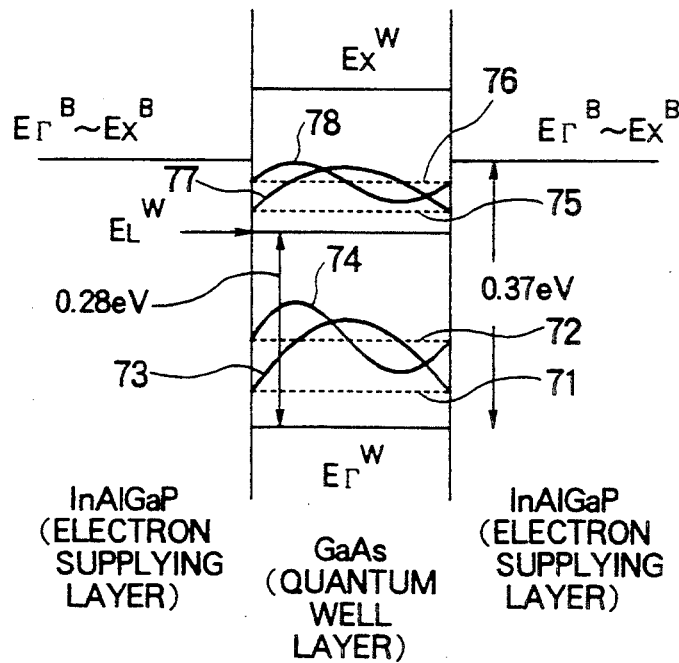
FIG. 10 is a potential profile for describing a quantum wire structure of the semiconductor device illustrated in FIG. 9.

Referring to FIG. 10, description will proceed to a potential energy level in relation to a direction perpendicular to the quantum wire structure of the semiconductor device 60 illustrated in. FIG. 9. In FIG. 10, $E_\Gamma^W$, $E_L^W$, and $E_X^W$ represent the first Γ-valley, the first L-valley, and the first X-valley potential energy levels, respectively, as described in conjunction with FIG. 2. Similarly $E_\Gamma^B$, $E_L^B$, and $E_X^B$ represent the second Γ-valley, the second L-valley, and the second X-valley potential energy levels, respectively.

Now, let m*Γ be $0.067m_0$ in Equation (1). Inasmuch as each of the width and the thickness is equal to 150 angstroms in the quantum wire structure, the ground level $\epsilon_{11}$ becomes to 0.05 eV in the first Γ-valley. Each of the first excitation levels $\epsilon_{12}$ and $\epsilon_{21}$ becomes to 0.12 eV in the first Γ-valley.

As shown in FIG. 10, the first Γ-valley potential energy level is lower in 0.28 eV than the first L-valley potential energy level. Each of the second Γ-valley, the second L-valley, and the second X-valley potential energy levels is approximately equal to one another. The first Γ-valley potential energy level is lower in 0.37 eV than the second Γ-valley potential energy level at the heterojunction surface between the quantum well layer 62 and the electron supplying layer 61.

Accordingly, the first Γ-valley has at least one one-dimensional subband. In the example being illustrated in FIG. 10, the first Γ-valley has a pair of one-dimensional subbands of which levels are depicted by reference numbers 71 and 72, respectively. In the one-dimensional subband having the level depicted by 71, electrons have a wave function depicted by a reference number 73. In the one-dimensional subband having the level depicted by 72, electrons have a wave function depicted by a reference number 74.

Similarly, the first L-valley has at least one one-dimensional subband inasmuch as the first L-valley potential energy level is lower than the second potential energy level. In the example being illustrated in FIG. 10, the first L-valley has a pair of one-dimensional subbands of which levels are depicted by reference numbers 75 and 76, respectively. In the one-dimensional subband having the level depicted by 75, electrons have a wave function depicted by a reference number 77. In the 15.one-dimensional subband having the level depicted by 76, electrons have a wave function depicted by a reference number 78.

As readily understood from the above description, the electron supplying layer 61 serves as a quantum barrier layer in the third embodiment.

Now, it will be assumed that the electron supplying layer 61 is composed of $In_{0.49}(Al_zGa_{1-z})_{0.51}P$, where z represents a variable between zero and one (both exclusive). Equation (3) is satisfied when the variable z is not less than 0.4. Inasmuch as the electron affinity becomes to a minimum value when the variable z is equal to 0.7 in $In_{0.49}(Al_zGa_{1-z})_{0.51}P$, it is desirable to make the variable z be about 0.7 in order to effectively improve the electron transport property in the semiconductor device 60.

Figure 11:
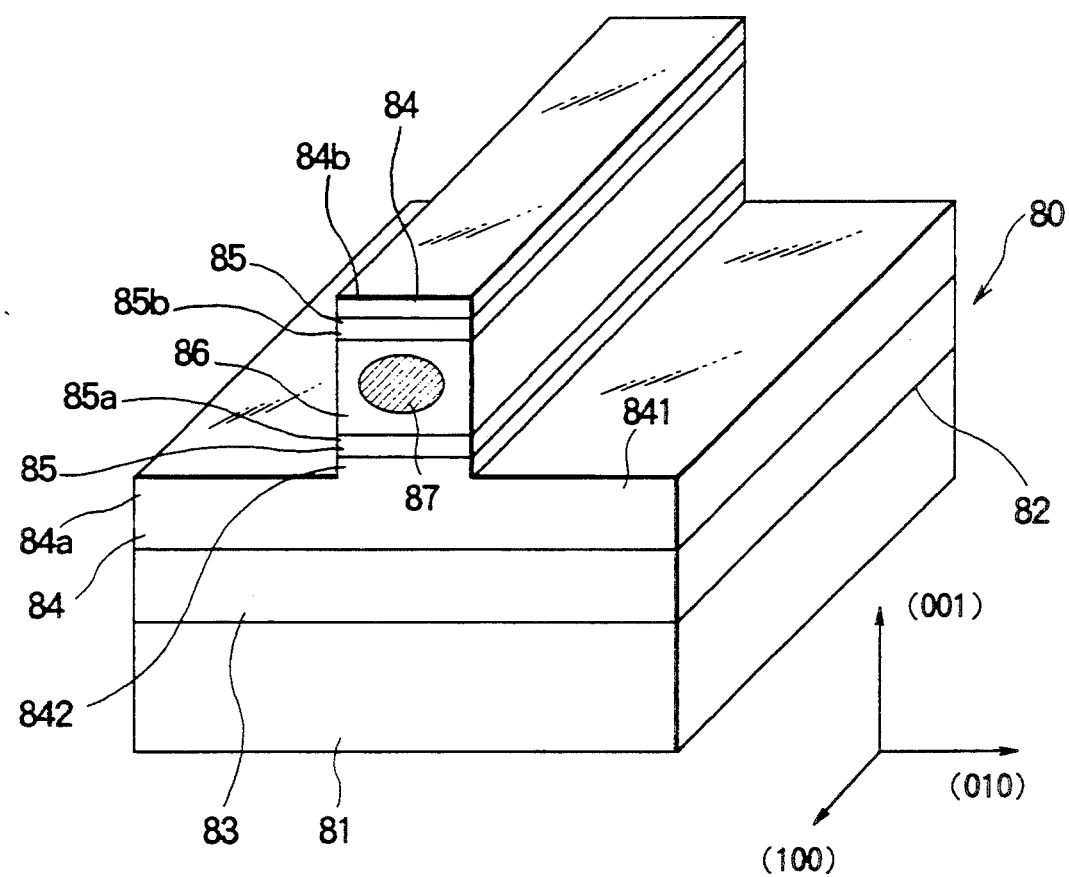
FIG. 11 shows a perspective view of a semiconductor device according to a fourth embodiment of this invention.

Referring to FIG. 11, description will proceed to a semiconductor device of a fourth embodiment according to this invention. The illustrated semiconductor device is different in structure from the semiconductor device 20 illustrated in FIG. 5 and is therefore designated afresh by a reference numeral 80.

The semiconductor device 80 comprises a semi-insulating substrate 81 which has a principal surface 82 directed upwards in FIG. 11 and a buffer layer 83 on the principal surface 82. The semiconductor device 80 further comprises an electron supplying layer 84, a spacer layer 85, and a quantum well layer 86.

In the example being illustrated, the semi-insulating substrate 81 is composed of InP and has the crystal surface of (001). The buffer layer 83 is composed of InAlAs which is undoped. It is noted that the electron supplying layer 84 comprises first and second supplying films 84a and 84b each of which is composed of an n-type InAlAs. Furthermore, the spacer layer 85 comprises first and second spacer films 85a and 85b each of which is composed of undoped InAlAs. The quantum well layer 86 is composed of undoped InGaAs and is interposed between the first spacer film 85a and the second spacer film 85b. The first supplying film 84a is formed on the buffer layer 83. The first spacer film 85a is formed on the first supplying film 84a. In addition, the second supplying film 84b is formed on the second spacer film 85b. The quantum well layer 86 has a quantum wire structure of which the crystal orientation is parallel to (100) orientation.

On manufacturing the semiconductor device 80 illustrated in FIG. 11, the semi-insulating substrate 81 is prepared which has a front surface and a rear surface directed upwards and downwards in FIG. 11, respectively.

The buffer layer 83 of undoped $In_{0.52}Al_{0.48}As$ is formed on the principal surface 82 to the thickness of 1 μm by the use of Molecular Beam Epitaxy (MBE). A first film is deposited on the buffer layer 83 to the thickness of 200 angstroms by MBE. The first film is composed of an n-type $In_{0.52}Al_{0.48}As$ of which a doping density is $1 \times 10^{19}/cm^3$. Sequentially, a second film of undoped $In_{0.52}Al_{0.48}As$ is formed on the first film by MBE to the thickness of 50 angstroms. A third film of undoped $In_{0.8}Ga_{0.2}As$ is formed on the second film by MBE to the thickness of 80 angstroms. A fourth film of undoped $In_{0.52}Al_{0.48}As$ is formed on the third film by MBE to the thickness of 50 angstroms. A fifth film is formed on the fourth film by MBE to the thickness of 200 angstroms. The fifth film is composed of an n-type $In_{0.52}Al_{0.48}As$ of which a doping density is $1 \times 10^{19}/cm^3$.

With Electron Beam lithography, the first through the fifth films are etched by the use of a mask which has a prescribed pattern. The first film is etched into the first supplying film 84a having a plate portion 841 and a projection portion 842 on a center of the plate portion 841. The second film is etched into the first spacer film 85a on the projection portion 842. The third through the fifth films are etched into the quantum well layer 86, the second spacer film 85b, and the second supplying film 84b, respectively. As described above, the quantum well layer 86 has a quantum wire structure of which the crystal orientation is parallel to (100) orientation and of which the width is 160 angstroms.

When applying the electric field to the semiconductor device 80, the one-dimensional electron gas is generated in the quantum well layer 86 and will be designated by a reference numeral 87 in FIG. 11.

As readily understood from description in conjunction with FIG. 11, the quantum well layer 86 serves as the first semiconductor layer. The electron supplying layer 84 serves as the second semiconductor layer in cooperation with the spacer layer 85.

Figure 12:
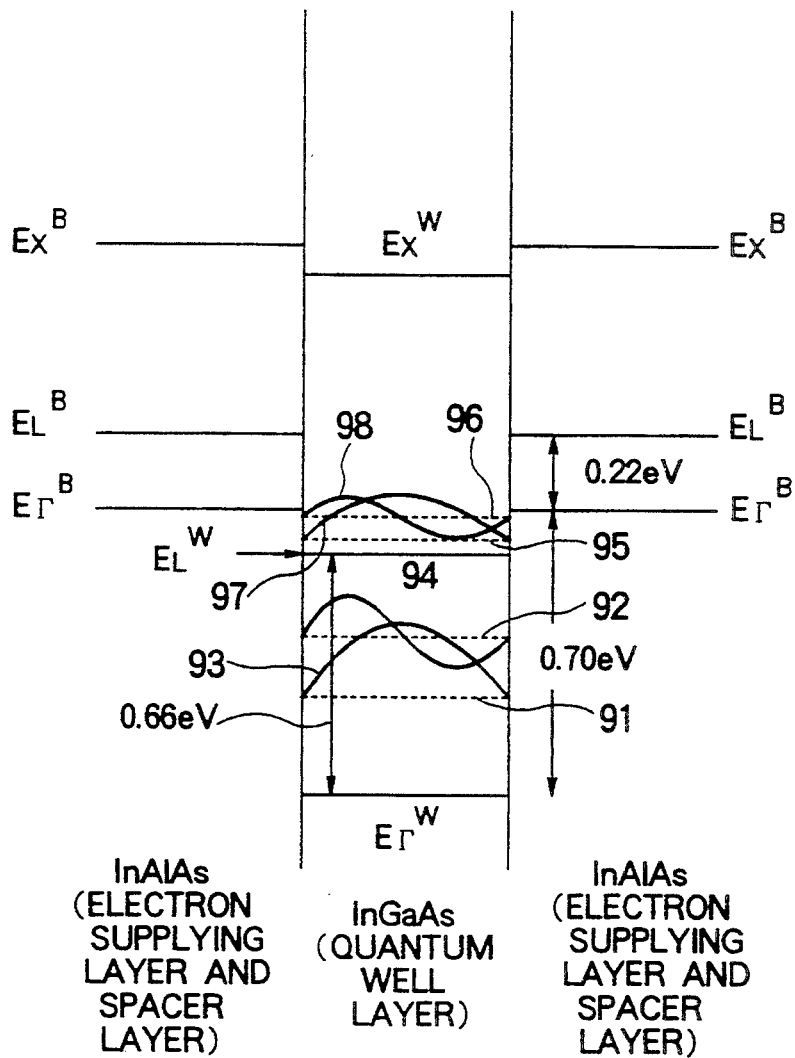
FIG. 12 is a potential profile for describing a quantum wire structure of the semiconductor device illustrated in FIG. 11.

Referring to FIG. 12, description will proceed to a potential energy level in relation to a direction perpendicular to the quantum wire structure of the semiconductor device 80 illustrated in FIG. 11. In FIG. 12, $E_\Gamma^W$, $E_L^W$ and $E_X^W$ represent the first Γ-valley, the first L-valley, and the first X-valley potential energy levels, respectively, as described in conjunction with FIG. 2. Similarly $E_\Gamma^B$, $E_L^B$, and $E_X^B$ represent the second Γ-valley, the second L-valley, and the second X-valley potential energy levels, respectively.

Now, let $m^*\Gamma$ be $0.032m_0$ in Equation (1). Inasmuch as the width Ly and the thickness Lz are equal to 80 angstroms and 160 angstroms in the quantum wire structure, respectively, the ground level $\epsilon_{11}$ becomes to 0.23 eV in the first Γ-valley. The first excitation level $\epsilon_{12}$ becomes to 0.36 eV in the first Γ-valley.

As shown in FIG. 12, the first Γ-valley potential energy level is lower in 0.66 eV than the first L-valley potential energy level. The second Γ-valley potential energy level is lower in 0.22 eV than the second L-valley potential energy level. The first Γ-valley potential energy level is lower in 0.70 eV than the second Γ-valley potential energy level at the heterojunction surface between the quantum well layer 86 and the electron supplying layer 84.

Accordingly, the first Γ-valley has at least one one-dimensional subband. In the example being illustrated in FIG. 12, the first Γ-valley has a pair of one-dimensional subbands of which levels are depicted by reference numbers 91 and 92, respectively. In the one-dimensional subband having the level depicted by 91, electrons have a wave function depicted by a reference number 93. In the one-dimensional subband having the level depicted by 92, electrons have a wave function depicted by a reference number 94.

Similarly, the first L-valley has at least one one-dimensional subband inasmuch as the first L-valley potential energy level is lower than the second potential energy level. In the example being illustrated in FIG. 12, the first L-valley has a pair of one-dimensional subbands of which levels are depicted by reference numbers 95 and 96, respectively. In the one-dimensional subband having the level depicted by 95, electrons have a wave function depicted by a reference number 97. In the one-dimensional subband having the level depicted by 96, electrons have a wave function depicted by a reference number 98.

As readily understood from the above description, the electron supplying layer 84 serves as a quantum barrier layer in cooperation with the spacer layer 85 in the fourth embodiment.

Now, it will be assumed that the quantum well layer 86 is composed of $In_xGa_{1-x}As$. Equation (3) is satisfied when the variable x is not less than 0.7. In the quantum well layer 86 composed of $In_xGa_{1-x}As$, a misfit dislocation occurs in the quantum well layer 86 when the thickness of the quantum well layer 86 is 100 angstroms at the variable x=0.8. The misfit dislocation occurs in the quantum well layer 86 when the thickness of the quantum well layer 86 is 50 angstroms at the variable x=1. In Equation (1), it will be assumed that the width Ly and the thickness Lz are equal to each other. When each of the width Ly and the thickness Lz is equal to 50 angstroms, the ground state level is estimated as 1.1 eV in the first Γ-valley in case where m*Γ is equal to 0.032 $m_0$. When each of the width Ly and the thickness Lz is equal to 100 angstroms, the ground state level is estimated as 0.28 eV in the first Γ-valley in case where m*Γ is equal to 0.032 $m_0$.

As described in conjunction with FIG. 12, the first L-valley potential energy level is higher in 0.66 eV than the first Γ-valley potential energy level when the quantum well layer 86 is composed of $In_{0.8}Ga_{0.2}As$. Therefore, the variable x should not be greater than 0.8 in the quantum well layer 86 to make the semiconductor device 80 maintain a one-dimensional carrier and to make the semiconductor device 80 be a direct transition type.

While this invention has thus far been described in conjunction with preferred embodiments thereof, it will readily be possible for those skilled in the art to put this invention into practice in various other manners. For example, the first and the second semiconductor layers may be composed of various other materials, respectively. Although Electron Beam lithography is used in the first through the fourth embodiments on forming the quantum wire structure, another process, for example, Fractional Layer Superlattice Epitaxy may be used on forming the quantum wire structure.

What is claimed is:

1. A semiconductor device having a quantum wire structure formed by first and second semiconductor layers, said quantum wire structure being extended towards a predetermined direction, said second semiconductor layer comprising:

a first electron supplying layer; and
   a second electron supplying layer;
   said first semiconductor layer being interposed between said first and said second-electron supplying layers:
   said first semiconductor layer having a first conduction band which has a first Γ-valley and a first L-valley, said first Γ-valley having a first Γ-valley energy level, said first L-valley having a first L-valley energy level which is not lower than said first Γ-valley energy level:
   said second semiconductor layer having a second conduction band which has a second energy level which is defined by an energy level of the bottom of said second conduction band and which is higher than said first L-valley energy level:
   said predetermined direction being parallel to a prescribed crystal orientation.

2. A semiconductor device as claimed in claim 1, wherein:
   said first semiconductor layer is used as a quantum well layer; and
   said second semiconductor layer being used as a quantum barrier layer.

3. A semiconductor device as claimed in claim 1, wherein said prescribed crystal orientation is (100) orientation.

4. A semiconductor device as claimed in claim 1, wherein:
   said first semiconductor layer is composed of InGaAs; and
   said second semiconductor layer being composed of AlGaAs.

5. A semiconductor device as claimed in claim 4, wherein:
   said first semiconductor layer is an undoped layer; and
   said second semiconductor layer being further composed of an impurity which is doped in said second semiconductor layer.

6. A semiconductor device as claimed in claim 4, further comprising a semi-insulating substrate and a buffer layer formed on said semi-insulating substrate, wherein:
   said second semiconductor layer is formed on said buffer layer.

7. A semiconductor device as claimed in claim 6, wherein:
   said semi-insulating substrate is composed of GaAs which is undoped; and
   said buffer layer being composed of GaAs which is undoped.

8. A semiconductor device as claimed in claim 5, wherein said impurity is an n-type impurity.

9. A semiconductor device as claimed in claim 5, wherein:
   said first semiconductor layer has a first composition which is given by $In_xGa_{1-x}As$, where x is a first variable between 0.1 and 0.3 (both inclusive); and
   said second semiconductor layer has a second composition which is given by $Al_yGa_{1-y}As$, where y is a second variable between 0.35 and 0.55 (both inclusive).

10. A semiconductor device as claimed in claim 1, wherein:

said first semiconductor layer is composed of InAs; and said second semiconductor layer being composed of AlGaSb.

11. A semiconductor device as claimed in claim 10, wherein:
said first semiconductor layer is an undoped layer; and
said second semiconductor layer being further composed of an impurity which is doped in said second semiconductor layer.

12. A semiconductor device as claimed in claim 10, further comprising a semi-insulating substrate, a superlattice layer formed on said semi-insulating substrate, and a buffer layer formed on said superlattice layer, wherein: said second semiconductor layer is formed on said buffer layer.

13. A semiconductor device as claimed in claim 12, wherein:
said semi-insulating substrate is composed of GaAs which is undoped;
said superlattice layer being composed of GaSb/AlSb which is undoped; and
said buffer layer being composed of AlGaSb which is undoped.

14. A semiconductor device as claimed in claim 11, wherein said impurity is an n-type impurity.

15. A semiconductor device as claimed in claim 11, wherein said second semiconductor layer has a composition which is given by $Al_yGa_{1-y}Sb$, where y is a variable between zero and one (both inclusive).

16. A semiconductor device as claimed in claim 15, wherein said variable y is equal to one.

17. A semiconductor device as claimed in claim 1, wherein:
said first semiconductor layer is composed of GaAs; and
said second semiconductor layer being composed of InAlGaP.

18. A semiconductor device as claimed in claim 17, wherein:
said first semiconductor layer is an undoped layer; and
said second semiconductor layer being further composed of an impurity which is doped in said second semiconductor layer.

19. A semiconductor device as claimed in claim 17, further comprising a semi-insulating substrate, wherein:
said second semiconductor layer is formed on said buffer layer.

20. A semiconductor device as claimed in claim 19, wherein:
said semi-insulating substrate is composed of GaAs which is undoped; and
said buffer layer being composed of GaAs which is undoped.

21. A semiconductor device as claimed in claim 18, wherein said impurity is an n-type impurity.

22. A semiconductor device as claimed in claim 21, wherein said second semiconductor layer comprises:
a main film composed of InAlGaP; and
an additional film located in said main film, said additional film including said impurity.

23. A semiconductor device as claimed in claim 22, wherein said impurity is silicon.

24. A semiconductor device as claimed in claim 18, wherein said second semiconductor layer has a composition which is given by $In_{0.49}(Al_zGa_{1-z})_{0.51}P$, where z is a variable between 0.4 and 1 (both inclusive).

25. A semiconductor device as claimed in claim 1, wherein:
said first semiconductor layer is composed of InGaAl; and
said second semiconductor layer being composed of InAlAs.

26. A semiconductor device as claimed in claim 25, wherein:
said first semiconductor layer is an undoped layer; and
said second semiconductor layer being further composed of an impurity which is doped in said second semiconductor layer.

27. A semiconductor device as claimed in claim 25, further comprising a semi-insulating substrate and a buffer layer formed on said semi-insulating substrate, wherein:
said second semiconductor layer is formed on said buffer layer.

28. A semiconductor device as claimed in claim 27, wherein:
said semi-insulating substrate is composed of InP which is undoped; and
said buffer layer being composed of InAlAs which is undoped.

29. A semiconductor device as claimed in claim 26, wherein said impurity is an n-type impurity.

30. A semiconductor device as claimed in claim 26, wherein said second semiconductor layer comprises:
a main film composed of InAlAs and said impurity; and
a spacer film composed of InAlAs which is undoped, said first semiconductor layer being interposed by said spacer film.

31. A semiconductor device as claimed in claim 26, wherein:
said first semiconductor layer has a first composition which is given by $In_xGa_{1-x}As$, where x is a variable between 0.7 and 0.8 (both inclusive); and
said second semiconductor layer having a second composition which is given by $In_{0.52}Al_{0.48}As$.

* * * * *

UNITED STATES PATENT AND TRADEMARK OFFICE
CERTIFICATE OF CORRECTION

PATENT NO. : 5,412,232
DATED : May 2, 1995
INVENTOR(S) : Yuji Ando

It is certified that error appears in the above-identified patent and that said Letters Patent is hereby corrected as shown below:

At the title page, line [22], "Mar. 11, 1993" should be --Mar. 11, 1994--.

At the title page, line [30], "Mar. 12, 1994" should be --Mar. 12, 1993--.

Signed and Sealed this

Eighth Day of August, 1995

Attest:

BRUCE LEHMAN

*Attesting Officer*    *Commissioner of Patents and Trademarks*